United States Patent [19]

Sano et al.

[11] Patent Number: 4,996,501
[45] Date of Patent: Feb. 26, 1991

[54] AMPLIFIER CIRCUIT HAVING GAIN CONTROL

[75] Inventors: Yoshiaki Sano, Yokohama; Toshio Hanazawa, Kasugai; Yoshiro Yoshino, Nagoya, all of Japan

[73] Assignees: Fujitsu Limited, Kawasaki; Fujitsu VLSI Limited, Kasugai, both of Japan

[21] Appl. No.: 286,610

[22] Filed: Dec. 19, 1988

[30] Foreign Application Priority Data

Dec. 18, 1987 [JP] Japan .................... 62-320817

[51] Int. Cl.$^5$ .............................................. H03G 3/30
[52] U.S. Cl. .................................... 330/279; 330/279
[58] Field of Search ............... 330/129, 131, 135, 141, 330/278, 279, 281, 311; 307/540

[56] References Cited

U.S. PATENT DOCUMENTS 4,489,281 12/1984 Kiyono .............................. 330/129
4,742,565 5/1988 Iwahashi ...................... 330/279 X

FOREIGN PATENT DOCUMENTS 0129856 10/1979 Japan ................................ 330/279

Primary Examiner—Steven Mottola
Attorney, Agent, or Firm—Staas & Halsey

[57] ABSTRACT

An amplifier circuit comprises a variable gain amplifier for receiving an input signal which is to be amplified by the amplifier circuit with a variable gain. The variable gain is controlled by a control signal. The amplifier circuit also includes a constant gain amplifier for amplifying a signal outputted from the variable gain amplifier with a constant gain, and a gain control circuit responsive to a signal outputted from the constant gain amplifier so as to supply the control signal to the variable gain amplifier. The signal from the constant gain amplifier is outputted as an output signal of the amplifier circuit, and the gain control circuit generates the control signal during a time period in which a level of the output signal of the constant gain amplifier is higher than a reference level which is a predetermined value lower than a peak value of the output signal of the constant gain amplifier.

12 Claims, 5 Drawing Sheets

AMPLIFIER CIRCUIT HAVING GAIN CONTROL

BACKGROUND OF THE INVENTION

The present invention generally relates to amplifier circuits, and more particularly to an amplifier circuit provided with a variable gain amplifier a gain of which is limited when an input signal level is excessively large.

Normally, a linear amplifier circuit is used as an amplifier circuit for amplifying an audio signal, and amplitudes of an output signal $V_{out}$ and an input signal $V_{in}$ of the amplifier circuit have a predetermined proportional relationship as shown in FIG. 1. This predetermined proportional relationship is maintained until a transistor at an output stage of the amplifier circuit saturates. However, in a saturation region of the output stage transistor where the amplitude of the input signal $V_{in}$ is greater than $V_s$, the waveform of the input signal $V_{in}$ does not coincide with the waveform of the output signal $V_{out}$. In other words, the proportional relationship differs about the input signal $V_{in}$ of $V_s$ as indicated by a solid line in FIG.1. In the saturation region of the output stage transistor, there is a notable deterioration in a distortion factor due to higher harmonic components as may be seen from FIG. 2.

A conventional amplifier circuit has a variable amplifier for amplifying an input signal, a constant gain amplifier for amplifying an output signal of the variable gain amplifier and for outputting an output signal $V_{out}$, and a level detection circuit for detecting an output signal level of the variable gain amplifier. The level detection circuit variably controls the variable gain amplifier so as to limit the level of the output signal $V_{out}$ to $V_{Lo}$ as indicated by a phantom line in FIG.1 when the output signal of the variable gain amplifier is greater than a predetermined level, that is, when the level of the input signal of the constant gain amplifier is greater than $V_{Li}$ and excessively large. Such a conventional amplifier circuit is known as an automatic gain control (AGC) circuit or an automatic level control (ALC) circuit.

In the conventional amplifier circuit, the level of the output signal $V_{out}$ is limited to $V_{Lo}$ which is constant when the input signal $V_{in}$ is greater than $V_{Li}$. As a result, there is a problem in that no signal amplification can be carried out in a vicinity of a maximum tolerable input signal level of the constant gain amplifier. In addition, there is also a problem in that a circuit operation of the constant gain amplifier becomes unstable when a change occurs in a power source voltage.

In other words, the output signal of the constant gain amplifier is clipped at a clipping level when the level of the input signal is greater than the maximum tolerable input signal level of the constant gain amplifier, and in a case where the input signal is an audio signal the sound is distorted. For this reason, the conventional amplifier circuit reduces the gain of the variable gain amplifier by a feedback loop when the output signal of the constant gain amplifier is greater than a reference level. In this case, it is desirable that the reference level is slightly lower than the clipping level. However, the clipping level of the constant gain amplifier differs depending on the amplifier circuit (that is, an integrated circuit of the amplifier circuit) and also changes depending on a change in the power source voltage. When the reference level is high, there is no feedback by the feedback loop when the clipping level is low thereby lacking in the flexibility of use of the amplifier circuit.

SUMMARY OF THE INVENTION

Accordingly, it is a general object of the present invention to provide a novel and useful amplifier circuit in which the problems described above are eliminated.

Another and more specific object of the present invention is to provide an amplifier circuit comprising a variable gain amplifier supplied with an input signal which is to be amplified by the amplifier circuit for amplifying the input signal with a gain which is variably controlled by a control signal, a constant gain amplifier for amplifying a signal outputted from the variable gain amplifier with a constant gain, and a gain control circuit responsive to a signal outputted from the constant gain amplifier for supplying the control signal to the variable gain amplifier. The signal from the constant gain amplifier is outputted as an output signal of the amplifier circuit, and the gain control circuit generates the control signal during a time period in which a level of the output signal of the constant gain amplifier is higher than a reference level which is a predetermined value lower than a peak value of the output signal of the constant gain amplifier. According to the amplifier circuit of the present invention, it is possible to satisfactorily amplify the input signal in a vicinity of a maximum tolerable input signal level even when the input signal level is excessively large, without limiting the output signal level constant In addition, the amplifier circuit can operate stably even when a change occurs in a power source voltage.

Other objects and further features of the present invention will be apparent from the following detailed description when read in conjunction with the accompanying drawings.

DESCRIPTION OF THE PREFERRED EMBODIMENTS

Figure 1:
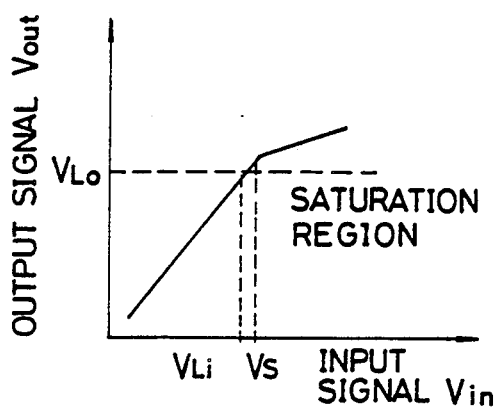
FIG.1 is a graph of an input signal versus output signal characteristic of a conventional amplifier circuit.
Figure 2:
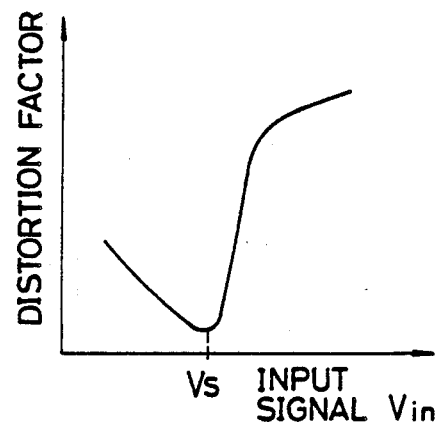
FIG. 2 is a graph an input signal versus distortion factor characteristic of the conventional amplifier circuit.
Figure 3:
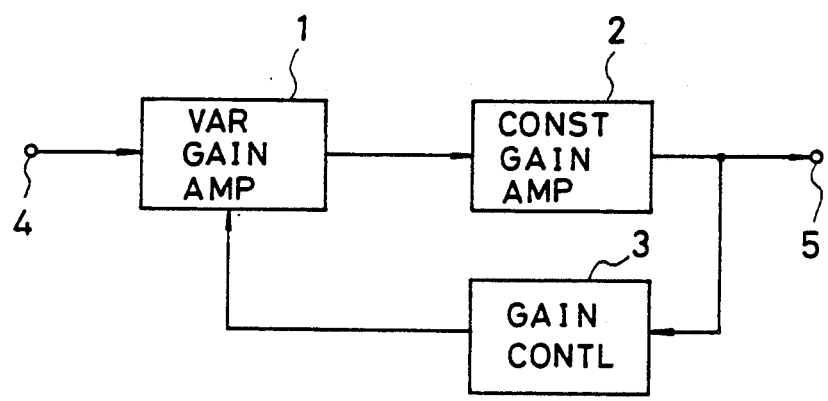
FIG. 3 is a system block diagram showing an embodiment of an amplifier circuit according to the present invention.

FIG. 3 shows an embodiment of an amplifier circuit according to the present invention. In FIG. 3, an amplifier circuit has a variable gain amplifier 1 for amplifying an input signal received at an input terminal 4, a constant gain amplifier 2 for amplifying an output signal of the variable gain amplifier 1, and a gain control circuit 3 responsive to an output signal of the constant gain amplifier 2 for variably controlling a gain of the variable gain amplifier 3. The output signal of the constant gain amplifier 2 is outputted from an output terminal 5 as an output signal of the amplifier circuit.

Figure 4:
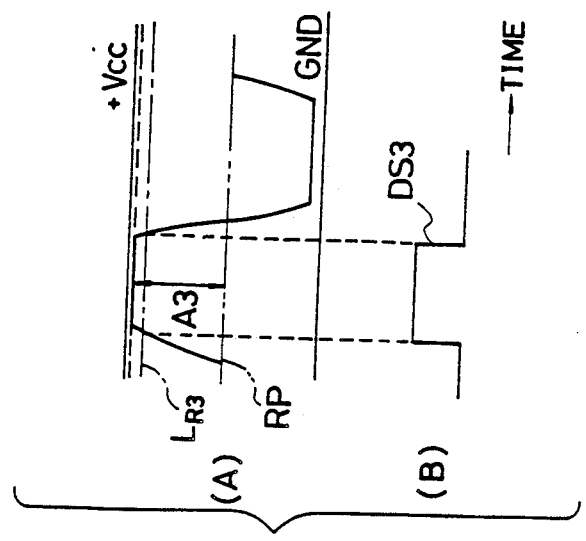
FIG. 4 is a graph showing the output signal of a constant gain amplifier and a corresponding distortion detection signal outputted from a gain control circuit of the embodiment shown in FIG. 3.

For example, the gain control circuit 3 detects a peak value A1 (FIG. 4(A)) of the output signal of the constant gain amplifier 2 and produces a distortion detection signal DS=DS1 shown in FIG. 4(B) which describes a distortion in the output signal of the constant gain amplifier 2. The distortion detection signal DS=DS1 is produced based on a reference level $L=L_{R1}$ indicated by a one-dot chain line which is a predetermined value smaller than a detected peak value $A=A1$, indicated by a broken line, the output signal of the constant gain amplifier 2. That is, the high-level signal portion of the distortion detection signal DS is produced during a time in which the output signal of the constant gain amplifier 2 is higher than the reference level $L_{R1}$.

Figure 6:
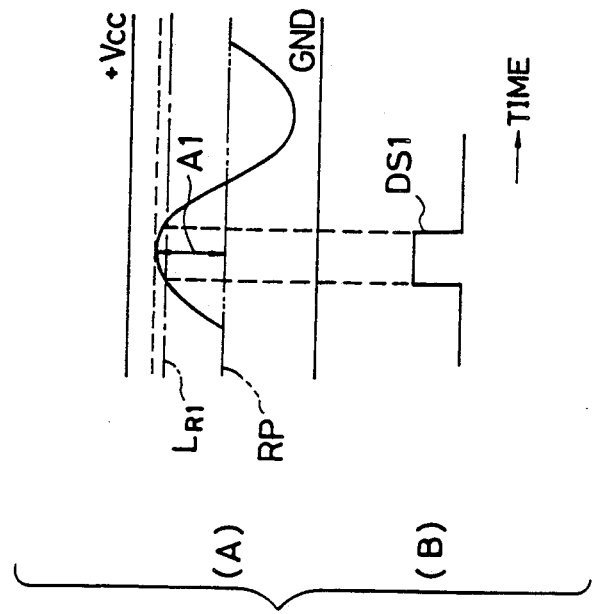
FIG. 6 respectively shows still another output signal of the constant gain amplifier and a corresponding distortion detection signal outputted from the gain control circuit of the embodiment shown in FIG.3.
Figure 5:
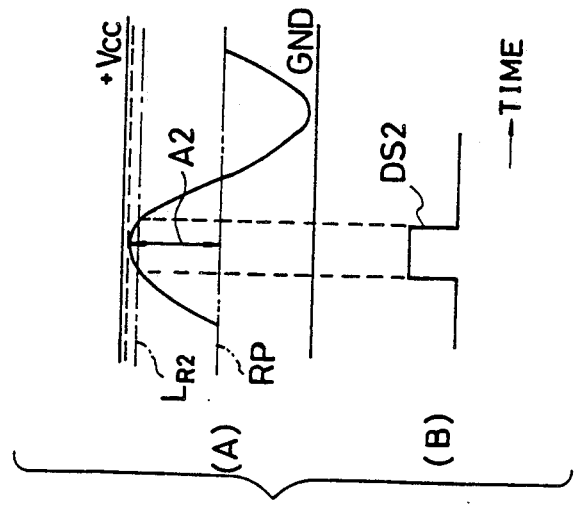
FIG. 5 is a graph showing the another output signal of the constant gain amplifier and a corresponding distortion detection signal outputted from the gain control circuit of the embodiment shown in FIG.3.

In a case where the output signal of the constant gain amplifier 2 is as shown in FIG. 5(A), a reference level $L=L2$ is the predetermined value smaller than a detected peak value $A=A2$ and the gain control circuit 3 produces a distortion detection signal DS=DS2 shown in FIG. 5(B). Similarly, in a case where the output signal of the constant gain amplifier 2 is as shown in FIG. 6(A), a reference level $L=L3$ is the predetermined value smaller than a detected peak value $A=A3$ and the gain control circuit 3 produces a distortion detection signal DS=DS3 shown in FIG. 6(B). Therefore, the reference level L is always the predetermined value smaller than the peak value A.

In FIGS. 4(A) through 6(B), +Vcc denotes a power source voltage, GND denotes a ground voltage, and RP denotes a reference point.

The gain control circuit 3 variably controls the gain of the variable gain amplifier 1 based on the distortion detection signal DS. For this reason, even when the input signal level at the input terminal 4 is excessively large, it is possible to satisfactorily amplify the input signal even in a vicinity of a maximum tolerable input signal level without limiting the output signal level at the output terminal 5 constant. In addition, the amplifier circuit can operate stably even when a change occurs in a power source voltage.

Figure 7:
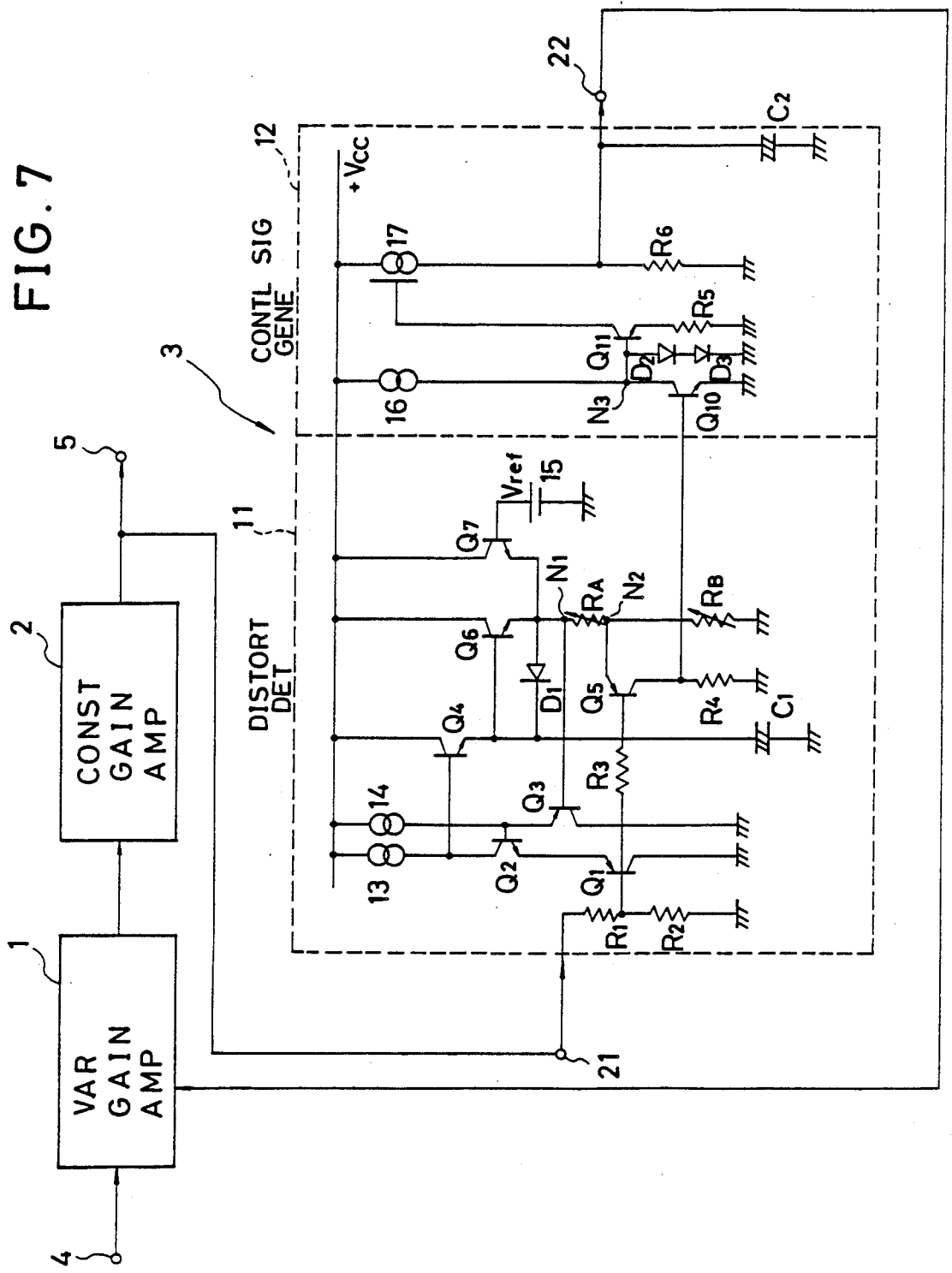
FIG. 7 is a circuit diagram showing an embodiment of the gain control circuit together with a variable gain amplifier and the constant gain amplifier of the embodiment shown in FIG.3.

FIG. 7 shows an embodiment of the gain control circuit 3 together with the variable gain amplifier 1 and the constant gain amplifier 2 shown in FIG. 3. In FIG. 7, those parts which are the same as those corresponding parts in FIG. 3 are designated by the same reference numerals. The gain control circuit 3 has a distortion detector 11 and a control signal generator 12.

The distortion detector 11 has constant current sources 13 and 14, a power source 15 for supplying a reference voltage Vref, transistors Q1 through Q7, resistors R1 through R4, variable resistors $R_A$ and $R_B$, a diode D1, and a capacitor C1. The control signal generator 12 has a constant current source 16, transistors Q10 and Q11, a constant current source 17 controlled by the transistor Q11, resistors R5 and R6, diodes D2 and D3, and a capacitor C2. +Vcc denotes a power source voltage. The output signal of the constant gain amplifier 2 is supplied to the gain control circuit 3 through a terminal 21 and an output control signal of the gain control circuit 3 is supplied to the variable gain amplifier 1 through a terminal 22.

In the distortion detector 11, the reference voltage Vref which is used as a reference voltage of a comparator constituted by the transistors Q6 and Q7 is set to a sufficiently small voltage by considering the output signal level of the amplifier circuit, so that the reference level L is set to at least Vref even when the output signal level of the amplifier circuit, that is, the signal level at the terminal 21, is extremely small.

When the signal level at the terminal 21 is extremely small, the transistor Q7 is in an ON state so that a level at a terminal N1 is $Vref - V_{BE}(Q7)$ where $V_{BE}(Q7)$ denotes a base-emitter voltage of the transistor Q7. The signal level at a terminal N2 is determined by the signal level of the terminal N1 and a ratio of resistances of resistors $R_A$ and $R_B$. In this state, the signal level at the terminal 21 is low such that the base level of the transistor Q5 is lower than the signal level at the terminal N2 minus $V_{BE}(Q5)$, where $V_{BE}(Q5)$ denotes a base-emitter voltage of the transistor Q5. Therefore, the transistor Q5 is in an ON state so that the transistor Q10 is ON, the signal level at a terminal N3 is low, the transistor Q11 is OFF, and no current flows to the capacitor C2. For this reason, the terminal 22 provides no high-level signal.

Figure 8:
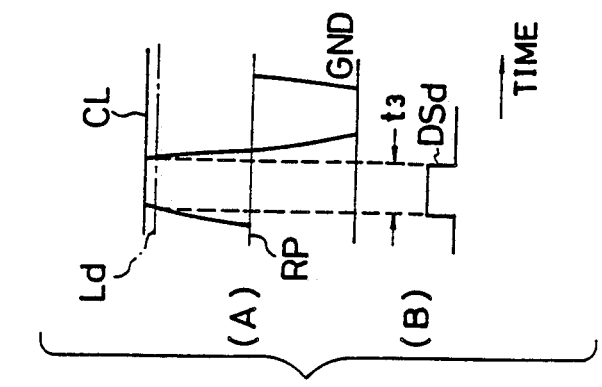
FIGS. 8, 9, 10 and 11 are respective graphs showing a signal supplied to the gain control circuit and a distortion detection signal produced thereby for explaining an operation of the gain control circuit shown in FIG. 7.

Hence, when there is no output signal or the output signal of the amplifier circuit is smaller than the reference voltage Vref as shown in FIG. 8(A), the reference level L=La is set to Vref. In this case, an output distortion detection signal DSa of the distortion detector 11 at the terminal N3 has a low level as shown in FIG. 8(B) and no control signal is outputted from the terminal 22.

When the output signal of the amplifier circuit is greater than the reference voltage Vref as shown in FIG. 9(A), the transistor Q5 turns OFF, the transistor Q10 also turns OFF and a distortion detection signal DSb shown in FIG. 9(B) having a pulse width t1 is obtained from the terminal N3 thereby outputting a control signal from the terminal 22. In other words, the resistors R1 and R2 are selected such that the transistor Q5 turns OFF when the signal level at the terminal 21 becomes higher than Vref.

Figure 9:
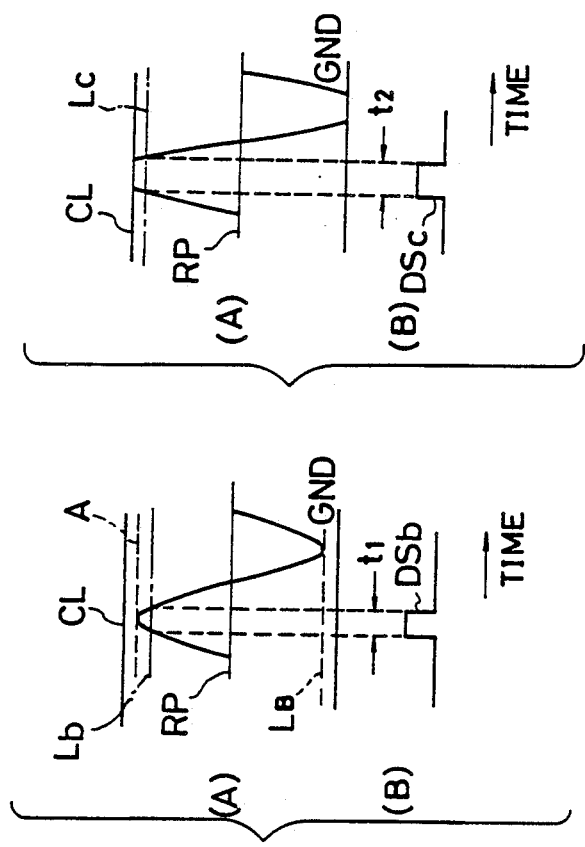

The transistors Q2 through Q4 and the capacitor C1 constitute a peak holding circuit. In the case of FIG. 9, the transistor Q1 turns OFF because a base potential of the transistor Q1 rises due to the signal from the terminal 21. And the transistor Q2 also turns OFF. The transistor Q4 turns ON due to the current source 13 so that the capacitor C1 is charged up. Following the charging up of the capacitor C1, the base level of the transistor Q6 rises and the transistor Q6 turns ON. As a result the level at the terminal N1 rises, the transistor Q3 turns OFF and the transistor Q2 turns ON. Then, the emitter level of the transistor Q1 rises, thereby the transistor Q1 turns ON. Because of the ON state of the transistor Q1, the transistor Q4 turns OFF and the charging up of the capacitor C1 is stopped. Therefore, the signal level at the terminal N1 is selected due to the signal level at the terminal 21 which is a peak value of the output signal of the constant gain amplifier 2. That is, the reference level L is determined by the signal level at the terminal 21.

Figure 10:
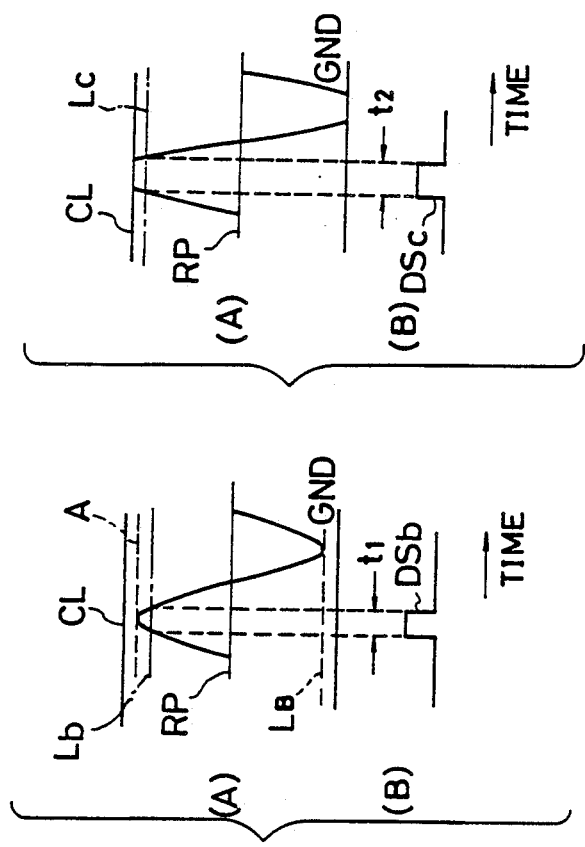
Figure 11:
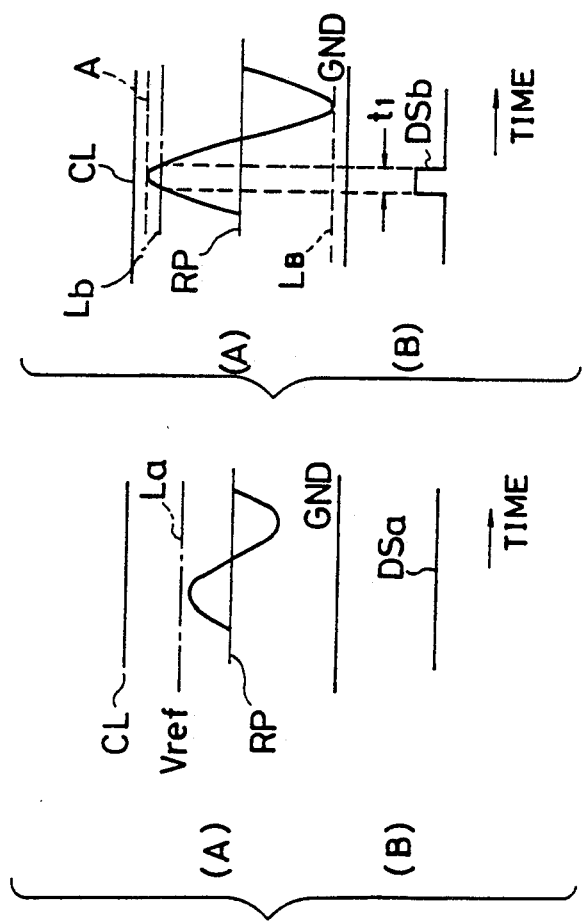

FIGS. 10(A) and 10(B) and FIGS. 11(A) and 11(B) are graphs showing cases where the peak value A of the signal received at the terminal 21 exceeds a clipping level CL of the constant gain amplifier 2. In these cases, reference levels Lc and Ld are set to identical levels which are a predetermined value smaller than the clipping level CL. However, pulse widths t2 and t3 of corresponding distortion detection signals DSc and DSd differ in these cases. In other words, a pulse width t of the distortion detection signal DS changes depending on the degree of the clipping. In FIGS. 9(B), 10(B) and 11(B), a relation t1<t2<t3 stands.

In FIGS. 8(A) through 11(B), the same designations are used as in FIGS. 4(A) through 6(B).

The control signal generator 12 (FIG. 7) converts the distortion detection signal DS from the terminal N3 into a D.C. signal dependent on a change in the pulse width t, and this D.C. signal is outputted from the terminal 22 as the output control signal of the gain control circuit 3.

Figure 12:
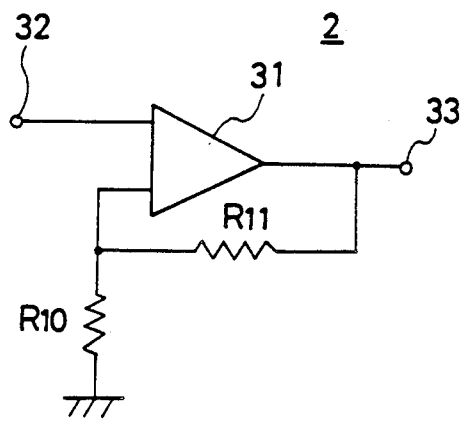
FIG. 12 is a circuit diagram showing the constant gain amplifier of the embodiment shown in FIG. 3.

A known constant gain amplifier may be used for the constant gain amplifier 2. FIG. 12 shows an example of the constant gain amplifier 2 having an amplifier 31 and resistors R10 and R11 which are connected as shown. The output signal of the variable gain amplifier 1 is applied to an input terminal 32, and the output signal of the constant gain amplifier 2 is obtained from an output terminal 33. In this case, a constant gain of approximately 1+(R10/R11) is obtained, where R10 and R11 respectively denote resistances of the resistors R10 and R11.

Figure 13:
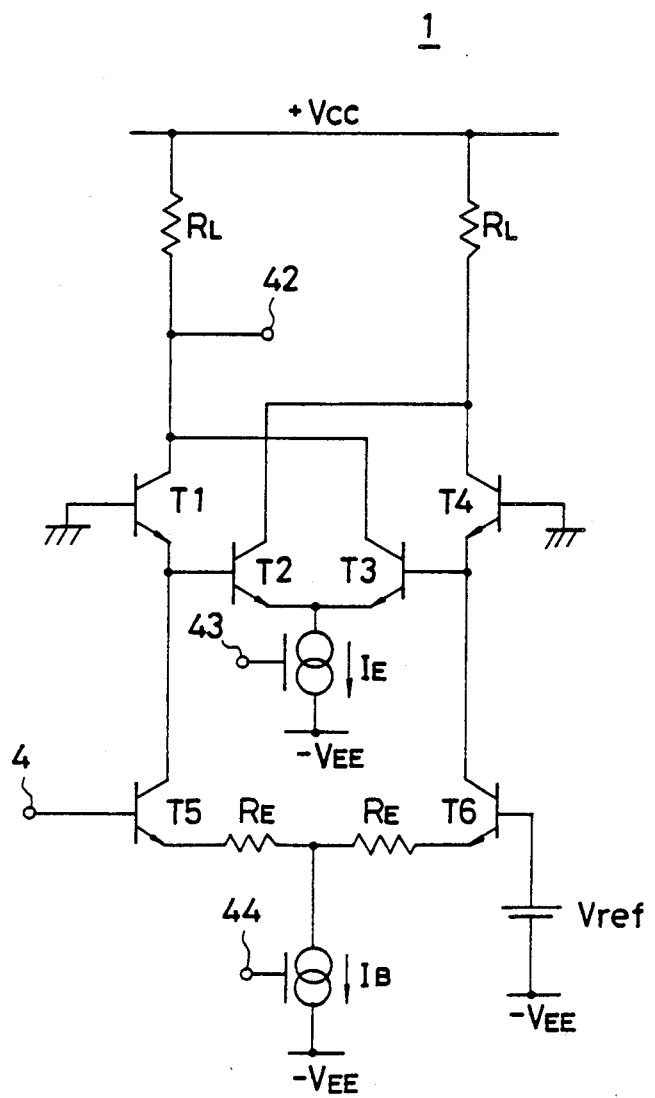
FIG. 13 is a circuit diagram showing the variable gain amplifier of the embodiment shown in FIG. 3.

In addition, a known variable gain amplifier may be used for the variable gain amplifier 1. FIG. 13 shows an example of the variable gain amplifier 1 having transistors T1 through T6, resistors $R_L$ and $R_E$, current sources $I_E$ and $I_B$, and a capacitor C which are connected as shown. $-V_{EE}$ denotes a power source voltage different from the power source voltage $+V_{cc}$. The output signal of the variable gain amplifier 1 is obtained from an output terminal 42. The control signal from the gain control circuit 3 is applied to a terminal 43 or 44. The gain of the variable gain amplifier 1 is variably controlled depending on the current $I_E$ or $I_B$ supplied by the corresponding one of the current sources $I_E$ and $I_B$.

In this embodiment, even when the power source voltage $+V_{cc}$ changes and the peak value A changes, the reference level L changes in accordance with the change in the peak value A. Thus, a stable circuit operation of the constant gain amplifier 2 is guaranteed. In addition, since the pulse width t of the distortion detection signal DS changes depending on a change in the degree of clipping, it is possible to obtain the output signal of the amplifier circuit with a constant amplification level by using this change in the pulse width t.

In other words, the gain control circuit 3 is provided with a peak holding circuit, and the reference level L is made variable by setting the reference level L a predetermined value lower than the peak value of the output signal of the constant gain amplifier 2. The feedback loop for variably controlling the gain of the variable gain amplifier 1 becomes active during a time when the output signal level of the constant gain amplifier 2 is higher than the variable reference level L. Accordingly, as shown in FIGS. 9(A), 9(B) to 11(A), 11(B) the variable reference level L is the predetermined value lower than the clipping level CL when the output signal level of the constant gain amplifier 2 is clipped, thereby making it possible to prevent distortion in the output signal of the constant gain amplifier 2. The longer the clipping time, the larger the variable gain width can be made in the negative direction. Therefore, it is possible to set the reference level L to an optimum value depending on the clipping level CL of the constant gain amplifier 2.

In the described embodiment, a positive peak value is detected with respect to the reference point RP, but it is of course possible to detect a negative peak value with respect to the reference point RF as indicated by $L_B$ in FIG.9(A), for example, and produce the distortion detection signal based on the detected negative peak value. Moreover, it is also possible to detect both the positive and negative peak values and produce the distortion detection signal based on the detected positive and negative peak values.

Further, the present invention is not limited to these embodiments, but various variations and modifications may be made without departing from the scope of the present invention

What is claimed is:

1. An amplifier circuit comprising:
    variable gain amplifier means having a variable gain, for amplifying an input signal by the variable gain in accordance with a control signal, and for providing an output responsive to the variable gain amplification;
    constant gain amplifier means having a constant gain, for amplifying a signal responsive to the signal outputted from said variable gain amplifier means and for providing an output responsive to the constant gain amplification; and
    gain control circuit means, responsive to the signal outputted from said control constant gain amplifier means, for supplying the control signal to said variable gain amplifier means during a time period in which a level of the output signal of said constant gain amplifier means is higher than a reference level which is a predetermined value lower than a peak value of the output signal of said constant gain amplifier means, and for adjusting said reference level based on the output of said constant gain amplifier means.

2. An amplifier circuit comprising:
    a variable gain amplifier supplied with an input signal which is to be amplified by the amplifier circuit for amplifying said input signal with a gain which is variably controlled by a control signal;
    a constant gain amplifier for amplifying a signal outputted from said variable gain amplifier with a constant gain; and
    a gain control circuit responsive to a signal outputted from said constant gain amplifier for supplying the control signal to said variable gain amplifier,
    the signal from said constant gain amplifier being outputted as an output signal of the amplifier circuit,
    said gain control circuit generating said control signal during a time period in which a level of the output signal of said constant gain amplifier is higher than a reference level which is a predetermined value lower than a peak value of the output signal of said constant gain amplifier.
    wherein said gain control circuit means—
    first circuit for producing a pulse distortion detection signal having a pulse width corresponding to the time period, said distortion detection signal describing a distortion in the output signal of said constant gain amplifier.

3. An amplifier circuit as claimed in claim 2 wherein said gain control circuit means further includes:
    second circuit means for generating a D.C. signal responsive to change in the pulse width of said distortion detection signal, said D.C. signal corresponding to said control signal.

4. An amplifier circuit as claimed in claim 3 wherein said second circuit means includes:
    means for generating the D.C. signal so that the variable gain of said variable gain amplifier means is variably controlled so as to keep the distortion approximately constant.

5. An amplifier circuit as claimed in claim 4, wherein said reference level is constant when the detected peak value is lower than a certain level.

6. An amplifier circuit as claimed in claim 5 wherein said certain level is a clipping level of said constant gain amplifier means.

7. An amplifier circuit as claimed in claim 1 wherein said gain control circuit means includes a circuit connected to detect a positive peak value of the output signal of said constant gain amplifier means corresponding to said peak value.

8. An amplifier circuit as claimed in claim 1 wherein said gain control circuit means includes a circuit connected to detect a negative peak value of the output signal of said constant gain amplifier means corresponding to said peak value.

9. An amplifier circuit as claimed in claim 1 wherein said gain control circuit means includes a circuit connected to detect a positive and a negative peak value of the output signal of said constant gain amplifier means corresponding to said peak value.

10. An amplifier circuit comprising:
    a variable gain amplifier supplied with an input signal which is to be amplified by the amplifier circuit for amplifying said input signal with a gain which is variably controlled by a control signal;
    a constant gain amplifier for amplifying a signal outputted from said variable gain amplifier with a constant gain; and
    a gain control circuit responsive to a signal outputted from said constant gain amplifier for supplying the control signal to said variable gain amplifier.
    the signal from said constant gain amplifier being outputted as an output signal of the amplifier circuit.
    said gain control circuit generating said control-signal during a time period in which a level of the output signal of said constant gain amplifier is higher than a reference level which is a predetermined value lower than a peak value of the output signal of said constant gain amplifier,
    said gain control circuit means includes means for varying generating a control signal so that the gain of said variable gain amplifier means is variably controlled to keep a distortion in the output signal of said constant gain amplifier means approximately constant.

11. An amplifier circuit as claimed in claim 1 further comprising:
    means for providing the reference level as a constant value when the peak value is lower than a certain level.

12. An amplifier circuit comprising:
    a variable gain amplifier supplied with an input signal which is to be amplified by the amplifier circuit for amplifying said input signal with a gain which is variably controlled by a control signal;
    a constant gain amplifier for amplifying a signal outputted from said variable gain amplifier with a constant gain; and
    a gain control circuit responsive to a signal-outputted from said constant gain amplifier for supplying the control signal to said variable gain amplifier.
    the signal from said constant gain amplifier being outputted as an output signal of the amplifier circuit,
    said gain control circuit generating said control signal during a time period in which a level of the output signal of said constant gain amplifier is higher than a reference level which is a predetermined value lower than a peak value of the output signal of said constant gain amplifier.
    said reference level being constant when the detected peak value is lower than a certain level.
    wherein said constant gain amplifier means has a clipping level and the certain level has a value corresponding to the clipping level of said constant gain amplifier means.

* * * * *